(12) United States Patent
Shin et al.

(10) Patent No.: US 10,541,295 B2
(45) Date of Patent: Jan. 21, 2020

(54) DISPLAY DEVICE AND METHOD OF MANUFACTURING A DISPLAY DEVICE

(71) Applicant: Samsung Display Co., Ltd., Yongin-si, Gyeonggi-do (KR)

(72) Inventors: Hyuneok Shin, Gwacheon-si (KR); Gyungmin Baek, Yongin-si (KR); Juhyun Lee, Seongnam-si (KR); Kyeongsu Ko, Hwaseong-si (KR); Sanggab Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/919,011

(22) Filed: Mar. 12, 2018

(65) Prior Publication Data
US 2019/0027550 A1 Jan. 24, 2019

(30) Foreign Application Priority Data

Jul. 24, 2017 (KR) .................. 10-2017-0093709

(51) Int. Cl.
*H01L 27/32* (2006.01)
*H01L 51/00* (2006.01)
*H01L 51/56* (2006.01)

(52) U.S. Cl.
CPC ...... *H01L 27/3276* (2013.01); *H01L 51/0097* (2013.01); *H01L 51/56* (2013.01); *H01L 2227/323* (2013.01); *H01L 2251/301* (2013.01); *H01L 2251/5338* (2013.01); *H01L 2251/558* (2013.01)

(58) Field of Classification Search
CPC ....................................... H01L 27/30
See application file for complete search history.

(56) References Cited

U.S. PATENT DOCUMENTS

| | | | |
|---|---|---|---|
| 2007/0215867 A1* | 9/2007 | Kawakami | C07C 211/61 257/40 |
| 2016/0322565 A1 | 11/2016 | Kim et al. | |
| 2017/0025444 A1* | 1/2017 | Hirakata | H01L 27/1225 |

FOREIGN PATENT DOCUMENTS

| | | |
|---|---|---|
| KR | 10-2004-0081887 A | 9/2004 |
| KR | 10-2013-0135185 A | 12/2013 |
| KR | 10-2015-0092814 A | 8/2015 |

* cited by examiner

*Primary Examiner* — Cheung Lee
(74) *Attorney, Agent, or Firm* — Lewis Roca Rothgerber Christie LLP (57) ABSTRACT

A display device may include an organic layer, a first metal layer on the organic layer, the first metal layer including a first metal, and a first oxidation resistant layer between the organic layer and the first metal layer, the first oxidation resistant layer including a nitride of the first metal.

19 Claims, 7 Drawing Sheets

DISPLAY DEVICE AND METHOD OF MANUFACTURING A DISPLAY DEVICE

CROSS-REFERENCE TO RELATED APPLICATION(S)

This application claims priority to, and the benefit of, Korean Patent Application No. 10-2017-0093709, filed on Jul. 24, 2017 in the Korean Intellectual Property Office (KIPO), the entire disclosure of which is incorporated by reference herein.

BACKGROUND

1. Field

Embodiments disclosed herein relate to display devices, such as flexible display devices, and methods of manufacturing the display devices.

2. Description of the Related Art

As information technology has developed, the market for display devices, which are connecting media between users and information, is increasing. Accordingly, usage of flat panel displays (FPDs), such as liquid crystal displays (LCDs), organic light-emitting diodes (OLEDs), and plasma display panels (PDPs) has increased.

If a display device has flexibility, the display device may be portable in a state of being curved, folded, or rolled, and accordingly, portability may be ensured while increasing a screen size of the display device. Accordingly, research on commercializing a display device including a flexible display panel has recently increased.

SUMMARY

An aspect of the present disclosure provides a display device from which a stain may not be visible.

An aspect of the present disclosure provides a method of manufacturing a display device for preventing a stain from being visible.

To achieve aspects of the present disclosure described above, a display device according to an embodiment may include an organic layer, a first metal layer on the organic layer, the first metal layer including a first metal, and a first oxidation resistant layer between the organic layer and the first metal layer, the first oxidation resistant layer including a nitride of the first metal.

The organic layer may include polyimide.

A thickness of the first oxidation resistant layer may be in a range from about 30 angstroms (Å) to about 200 Å.

The first metal may include titanium.

A ratio of nitrogen to titanium of the first oxidation resistant layer may be in a range from about 0.80 to about 1.15.

The display device may further include a second metal layer on the first metal layer, the second metal layer including a second metal that is different from the first metal.

The second metal may include aluminum.

The display device may further include a second oxidation resistant layer between the first metal layer and the second metal layer, the second oxidation resistant layer including a nitride of the first metal.

A thickness of the second oxidation resistant layer may be in a range from about 30 Å to about 200 Å.

The display device may further include a third metal layer on the second metal layer, the third metal layer including the first metal.

To achieve aspects of the present disclosure described above, a display device according to an embodiment may include a substrate including an organic material, and a wiring on the substrate, the wiring including a first oxidation resistant layer including titanium nitride, a first metal layer on the first oxidation resistant layer, the first metal layer including titanium, and a second metal layer on the first metal layer, the second metal layer including aluminum.

The wiring may be directly on the substrate.

A thickness of the first oxidation resistant layer may be in a range from about 30 Å to about 200 Å.

The wiring may further include a second oxidation resistant layer between the first metal layer and the second metal layer, the second oxidation resistant layer including titanium nitride.

The display device may further include an organic insulation layer between the substrate and the wiring, wherein the wiring is directly on the organic insulation layer.

The substrate may include a first region that is bendable, and second regions at opposite sides of the first region, and the wiring may be in the first region.

The wiring may extend from the first region to the second regions, and may connect the second regions.

The wiring may further include a third metal layer on the second metal layer, the third metal layer including titanium.

To achieve aspects of the present disclosure described above, a method of manufacturing a display device according to an embodiment may include forming a first oxidation resistant layer on a substrate including an organic material, the first oxidation resistant layer including titanium nitride, forming a first metal layer on the first oxidation resistant layer, the first metal layer including titanium, forming a second metal layer on the first metal layer, the second metal layer including aluminum, and simultaneously etching the first oxidation resistant layer, the first metal layer, and the second metal layer to form a wiring.

The method may further include forming a second oxidation resistant layer between the first metal layer and the second metal layer, the second oxidation resistant layer including titanium nitride, and simultaneously etching the first oxidation resistant layer, the first metal layer, the second oxidation resistant layer, and the second metal layer to form the wiring.

The display device according to embodiments disclosed herein may include the oxidation resistant layer between the organic layer and the wiring including a metal that may be oxidized when coming into contact with the organic layer. Accordingly, the formation of a metal oxide according to a contact between the organic layer and the wiring may be reduced or prevented, and a visualization of a stain according to non-uniformed etching of the metal oxide may be reduced or prevented.

The method of manufacturing the display device according to embodiments disclosed herein may include simultaneously etching the oxidation resistant layer and the metal layer, which are layered on the organic layer so as to form the wiring. Accordingly, a manufacturing process may be simplified.

BRIEF DESCRIPTION OF THE DRAWINGS

Illustrative, non-limiting embodiments will be more clearly understood from the following detailed description taken in conjunction with the accompanying drawings, in which.

DETAILED DESCRIPTION

Features of the inventive concept and methods of accomplishing the same may be understood more readily by reference to the following detailed description of embodiments and the accompanying drawings. Hereinafter, embodiments will be described in more detail with reference to the accompanying drawings. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1:
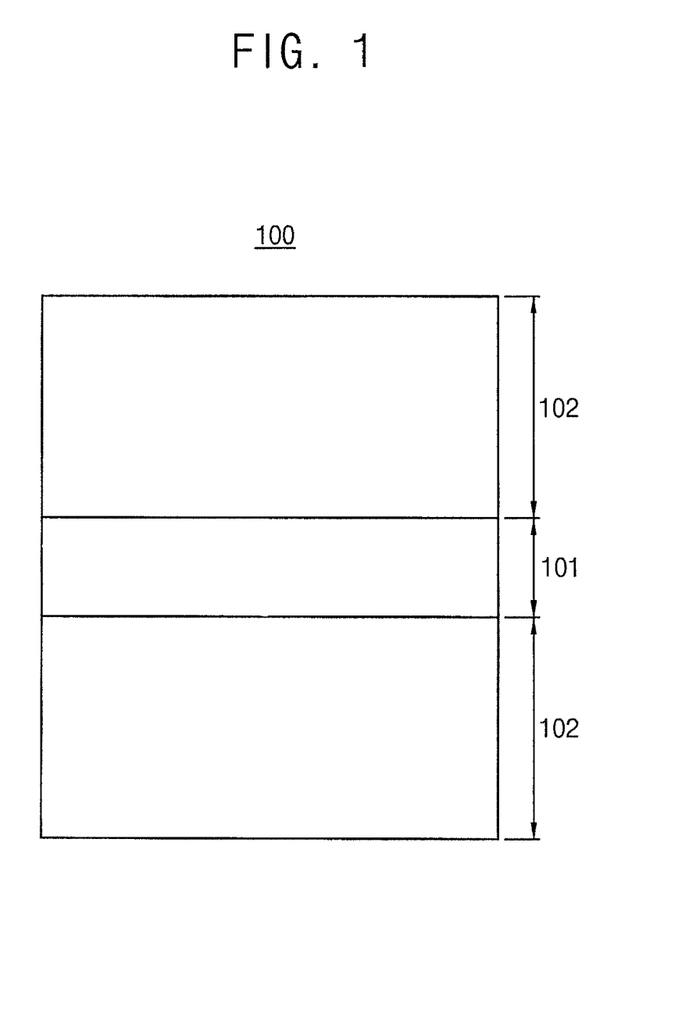
FIG. 1 is a plan view illustrating a display device according to an embodiment.

FIG. 1 is a plan view illustrating a display device according to an embodiment.

Referring to FIG. 1, a display device 100 according to an embodiment may include a first region 101 and second regions 102. The first region 101 may be a bending region that may be bent. The display device 100 may be bent by an angle of about 90 degrees or greater at the first region 101. The second region 102 may be a flat region. A display unit may be located in at least one of the second regions 102.

As illustrated in FIG. 1, the second regions 102 may be respectively located at opposite sides of the first region 101, with the first region 101 being therebetween. For example, the display device 100 may be bent at the first region 101, and an image may be displayed for a user at at least one of the second regions 102 among two second regions 102 at respective opposite sides of the first region 101.

Hereinafter, the display unit in the second region 102 will be explained with reference to FIG. 2.

Figure 2:
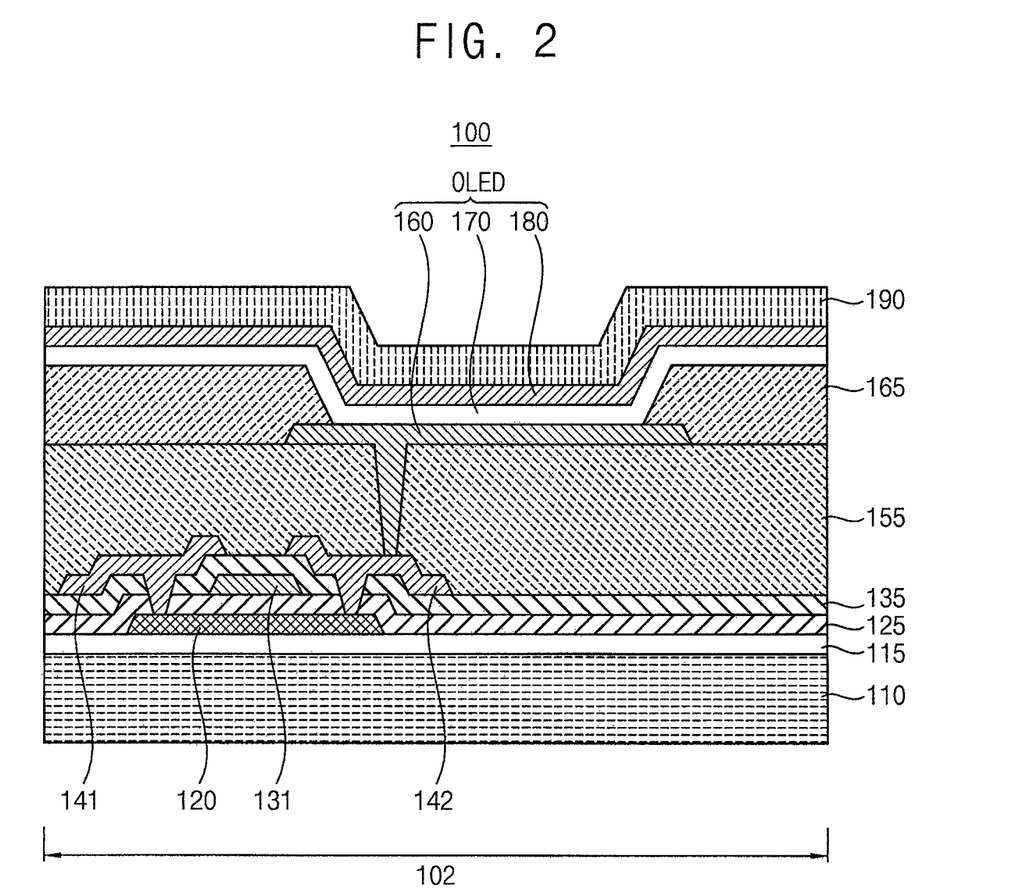
FIG. 2 is a cross-sectional view illustrating a second region of a display device according to an embodiment.

FIG. 2 is a cross-sectional view illustrating a second region of a display device according to an embodiment.

Referring to FIG. 2, the display unit may emit visible light corresponding to the image to be shown. The display unit may include various elements. For example, the display unit may include an organic light emitting element, a liquid crystal element, or the like. In the present embodiment of the display device 100, the display unit may include an organic light emitting element OLED.

A substrate 110 may include various materials. For example, the substrate 110 may be formed of glass, metal, or the like.

In an embodiment, the substrate 110 may include an organic material. For example, the substrate 110 may include polyimide (PI). In this case, the substrate 110 may have flexibility. Accordingly, the display device 100 according to the embodiment may have flexibility, and may be elongated two-dimensionally.

In an embodiment, the substrate 110 may include a material having a Poisson's ratio of about 0.4 or greater. The Poisson's ratio denotes a ratio of compression in one direction when a material is elongated by being pulled in the other direction. When the material forming the substrate 110 has a Poisson's ratio of about 0.4 or greater, the substrate 110 is sufficiently expanded, and the flexibility of the substrate 110 may be improved. Accordingly, a bending portion may be defined by the substrate 110, and the display device 100 may effectively include the bending portion.

A buffer layer 115 may be on the substrate 110. The buffer layer 115 may function as a barrier layer and/or a blocking layer that may effectively reduce or prevent dispersion of impurity ions and infiltration of moisture or external air, and that may planarize a surface of the substrate 110.

In an embodiment, the buffer layer 115 may include an inorganic material, and may be located only in the second region 102. In other words, the buffer layer 115 including the inorganic material may be on the substrate 110 and patterned to overlap only the second region 102 and to expose the first region 101.

A thin film transistor may be on the buffer layer 115. The thin film transistor may include an active layer 120, a gate electrode 131, a source electrode 141, and a drain electrode 142.

The active layer 120 may include amorphous silicon, polysilicon, or the like. The active layer 120 may include a channel region on which impurities are not doped, and a source region and a drain region doped with impurities on respective opposite sides of the channel region. Here, the impurities may vary depending on the thin film transistor, and N-type impurities or P-type impurities may be doped.

A gate insulation layer 125 may be on the active layer 120. The gate insulation layer 125 may have a multi-layered or a single-layered structure including an inorganic material, such as silicon oxide or silicon nitride. The gate insulation layer 125 may insulate the gate electrode 131 located thereon from the active layer 120.

In an embodiment, the gate insulation layer 125 may include an inorganic material, and may be located only in the second region 102. In other words, the gate insulation layer 125 including the inorganic material may be patterned to overlap only the second region 102 and to expose the first region 101.

The gate electrode 131 may be on the gate insulation layer 125. The gate electrode 131 may be fabricated by a photolithography process and an etching process.

The gate electrode 131 may include at least one selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and copper (Cu).

An insulation interlayer 135 may be on the gate electrode 131. The insulation interlayer 135 may have a multi-layered or a single-layered structure including an inorganic material, such as silicon oxide or silicon nitride. In an embodiment, the insulation interlayer 135 may have a dual-layer structure, such as $SiO_x/SiN_y$ or $SiN_x/SiO_y$.

In an embodiment, the insulation interlayer 135 may include an inorganic material, and may be located only in the second region 102. In other words, the insulation interlayer 135 including the inorganic material may be patterned to overlap only the second region 102 and to expose the first region 101.

The source electrode 141 and the drain electrode 142 may be on the insulation interlayer 135. The source electrode 141 and the drain electrode 142 may include at least one metal material selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

In an embodiment, the source electrode 141 and the drain electrode 142 may include aluminum (Al) and titanium (Ti) to improve flexural properties when forming a data line 143 of the first region 101, and will be described in detail below.

A via insulation layer 155 may be on the insulation interlayer 135 to cover the source electrode 141 and the drain electrode 142. A pixel electrode 160 may be on the via insulation layer 155. In an embodiment, the pixel electrode 160 may be connected to the drain electrode 142 through a via hole defined in the via insulation layer 155.

The via insulation layer 155 may include an insulating material. For example, the via insulation layer 155 may have a single-layered or a multi-layered structure including an inorganic material, an organic material, or an organic/inorganic compound material, which may be provided by using various deposition methods. In an embodiment, the via insulation layer 155 may include at least one selected from an polyacrylates resin, an epoxy resin, a phenolic resin, a polyamides resin, a polyimides resin, an unsaturated polyesters resin, a poly phenylenethers resin, a poly phenylenesulfides resin, and benzocyclobutene ("BCB").

Figure 3:
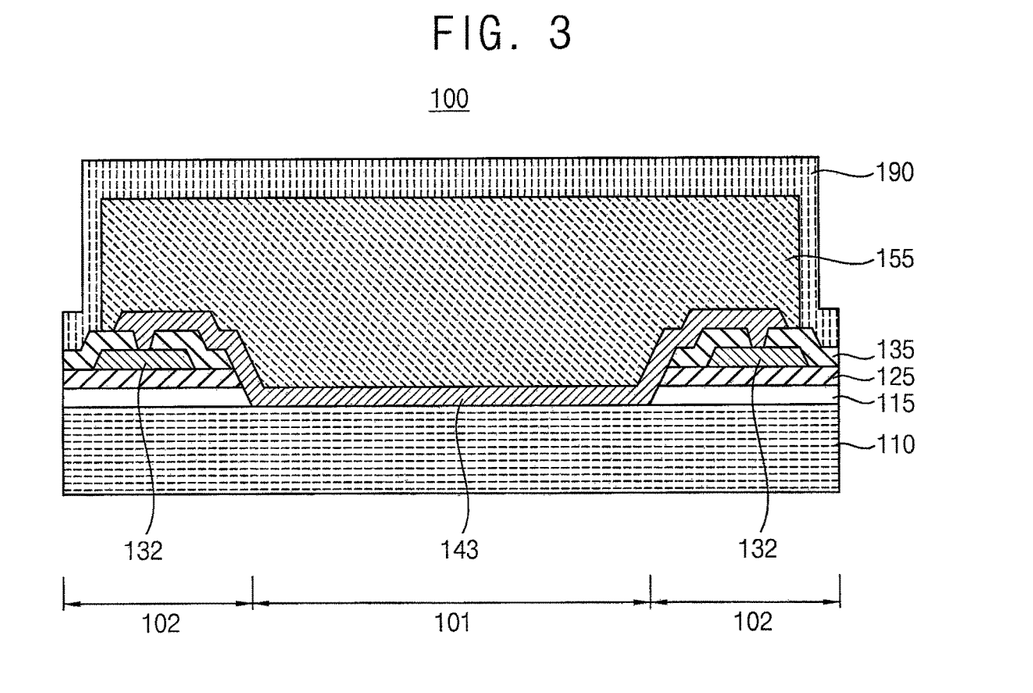
FIG. 3 is a cross-sectional view illustrating a first region and an edge portion of a second region of a display device according to an embodiment.

In an embodiment, the via insulation layer 155 may include an organic material, and may be patterned in the first region 101 and in the second regions 102. However, if the via insulation layer 155 including the organic material is on the entire surface of the second regions 102, a path of supplying moisture to the organic light emitting element OLED may occur due to the organic material. Therefore, a portion of the via insulation layer 155 at an edge portion of the second region 102 may be removed/omitted, as shown in FIG. 3.

The organic light emitting element OLED may be on the via insulation layer 155. The organic light emitting element OLED may include the pixel electrode 160, an intermediate layer 170 including an organic emission layer, and an opposite electrode 180. Moreover, the display device 100 may further include a pixel defining layer 165.

The pixel electrode 160 and/or the opposite electrode 180 may be transparent electrodes or reflective electrodes. In an embodiment, where the pixel electrode 160 and/or the opposite electrode 180 are transparent electrodes, the pixel electrode 160 and/or the opposite electrode 180 may include indium tin oxide ("ITO"), indium zinc oxide ("IZO"), ZnO, or $In_2O_3$. In an embodiment, where the pixel electrode 160 and/or the opposite electrode 180 are reflective electrodes, the pixel electrode 160 and/or the opposite electrode 180 may include a reflective layer including Ag, Mg, Al, Pt, Pd, Au, Ni, Nd, Ir, Cr, or a compound thereof, and a transparent layer including ITO, IZO, ZnO, or $In_2O_3$. In an embodiment, the pixel electrode 160 or the opposite electrode 180 may have an ITO/Ag/ITO structure.

The intermediate layer 170 may be between pixel electrode 160 and the opposite electrode 180. In an embodiment, the intermediate layer 170 includes the organic emission layer, and may further include at least one of a hole injection layer ("HIL"), a hole transport layer ("HTL"), an electron transport layer ("ETL"), and an electron injection layer ("EIL").

In an embodiment, the display device 100 may include a thin film encapsulation portion 190 on the organic light emitting element OLED to completely seal the organic light emitting element OLED, thereby protecting the organic light emitting element OLED against external moisture or oxygen. In an embodiment, the thin film encapsulation portion 190 may be on the organic light emitting element OLED, and opposite ends of the thin film encapsulation portion 190 may be coupled (e.g., adhered) to the substrate 110.

In an embodiment, the thin film encapsulation portion 190 may have a structure in which a plurality of thin film layers are stacked, that is, in which inorganic layers and organic layers may be alternately stacked. The inorganic layers may effectively prevent the infiltration of oxygen or moisture, and the organic layers may absorb stress applied to the inorganic layer to grant the flexibility.

The inorganic layer may be a single layer or a stacked layer including metal oxide or metal nitride. In an embodiment, the inorganic layers may include one of $SiN_x$, $Al_2O_3$, $SiO_2$, and $TiO_2$.

The organic layer may include a polymer, and may be a single layer or a stacked layer including, for example, one of polyethylene terephthalate, polyimide, polycarbonate, epoxy, polyethylene, and polyacrylate. In an embodiment, the organic layers may include polyacrylate. Specifically, the organic layer may include a polymerized monomer composition including diacrylate-based monomer and triacrylate-based monomer. The monomer composition may further include monoacrylate-based monomer. Also, the monomer composition may further include a well-known photoinitiator such as trimethyl benzoyl diphenyl phosphine oxide ("TPO"), although the described embodiments are not limited thereto.

Hereinafter, an embodiment of a cross-sectional structure of the first region 101 and the edge portions of the second regions 102 that are at opposite sides of the first region 101, with the first region 101 being therebetween, will be explained in detail with reference to FIG. 3.

FIG. 3 is a cross-sectional view illustrating a first region and an edge portion of a second region of a display device according to an embodiment.

Referring to FIG. 3, the buffer layer 115, the gate insulation layer 125, a gate line 132, the insulation interlayer 135, and a data line 143 may be sequentially located on the substrate 110 in the edge portion of the second region 102. An embodiment in which the buffer layer 115 is on the substrate 110 is illustrated in FIG. 3, however, the present disclosure is not limited thereto, and the gate insulation layer 125 may be on the substrate 110 without the buffer layer 115.

In an embodiment, the buffer layer 115 may include an inorganic material, and may be patterned to overlap only the second region 102 and to expose the first region 101. In an embodiment, the gate insulation layer 125 and the insulation interlayer 135 may include an inorganic material, and may be patterned to overlap only the second region 102 and to expose the first region 101.

An inorganic layer may have a single-layered structure or a stacked structure including metal oxide or metal nitride. Although the inorganic layer may reduce or prevent infiltration of oxygen or moisture, stress applied thereto may not be effectively reduced.

Thus, according to an embodiment of the display device 100, the buffer layer 115, the gate insulation layer 125, and the insulation interlayer 135 including the inorganic material may be substantially entirely removed from, or not provided in, the first region 101 at which the display device 100 may bend, and accordingly, the stress caused by bending may be reduced, and flexibility may be improved.

The data line 143 may be on the insulation interlayer 135. In an embodiment, the data line 143 may be formed on an entirety of the first region 101 to connect the gate lines 132 of the second regions 102 at the opposite sides of the first region 101 to each other. For example, the data line 143 may be connected to the gate line 132 through a contact hole formed in the insulation interlayer 135.

The data line 143 may be located directly on the substrate 110 in the first region 101. In other words, the data line 143 may be formed directly on the substrate 110, so that an upper surface of the substrate 110 directly contacts a lower surface of the data line 143. In an embodiment where the data line 143 connects the gate lines 132 of the two second regions 102 that are separate from each other, signals may be transferred between the second regions 102.

In an embodiment, the data line 143 may include aluminum (Al). Because the aluminum (Al) has high flexibility, the data line 143 may be formed to be curved on the substrate 110 in the first region 101 between the gate lines 132 of the two second regions 102. Further, when the first region 101 is bent, stress may not largely affect the data line 143 having high flexibility, and the data line 143 is not likely to be disconnected, and thus, the flexibility may be improved.

The via insulation layer 155 may be on the data line 143. In an embodiment, the via insulation layer 155 may include an organic material, and may be formed entirely on the first region 101 to cover the data line 143.

Because the via insulation layer 155 including the organic material is on the data line 143 in the first region 101 that is bendable, the via insulation layer 155 may absorb stress applied to the first region 101, and may provide flexibility. Therefore, according to an embodiment of the display device 100, the inorganic layer on the substrate 110 may be reduced or removed in the first region 101, and the organic layer and the data line 143 having high flexibility may be only on the substrate 110 in the first region 101. Thus, in such an embodiment, the stress applied to the first region 101 may be reduced, and cracking may be reduced or prevented even when the bending is repeatedly performed.

The thin film encapsulation portion 190 may be formed on the via insulation layer 155. In an embodiment, the thin film encapsulation portion 190 formed in the first region 101 may include only an organic layer.

In an embodiment, the inorganic layer may be removed/omitted only from the first region 101 that is the bending portion, but the embodiment is not limited thereto. In an alternative embodiment, the second region 102 may include a region from which the inorganic layer may be removed, as in the first region 101. In other words, the second region 102 may also have a bending region in which the inorganic layer may be removed to relieve the stress and to improve the flexibility within a range of maintaining connections between wires. Therefore, the region from which the inorganic layer may be removed is not limited to the first region 101 between the two second regions 102, as described above.

Hereinafter, an embodiment of a cross-sectional structure of the first region 101, and the edge portions of the second regions 102 that are at opposite sides of the first region 101 with the first region 101 being therebetween, will be explained in detail with reference to FIG. 4. Elements of the display device according to an embodiment illustrated in FIG. 4, which are similar to, or substantially the same as, those of the display device according to an embodiment illustrated in FIG. 3, may be described with the same reference number, and repeated descriptions thereof may be omitted.

Figure 4:
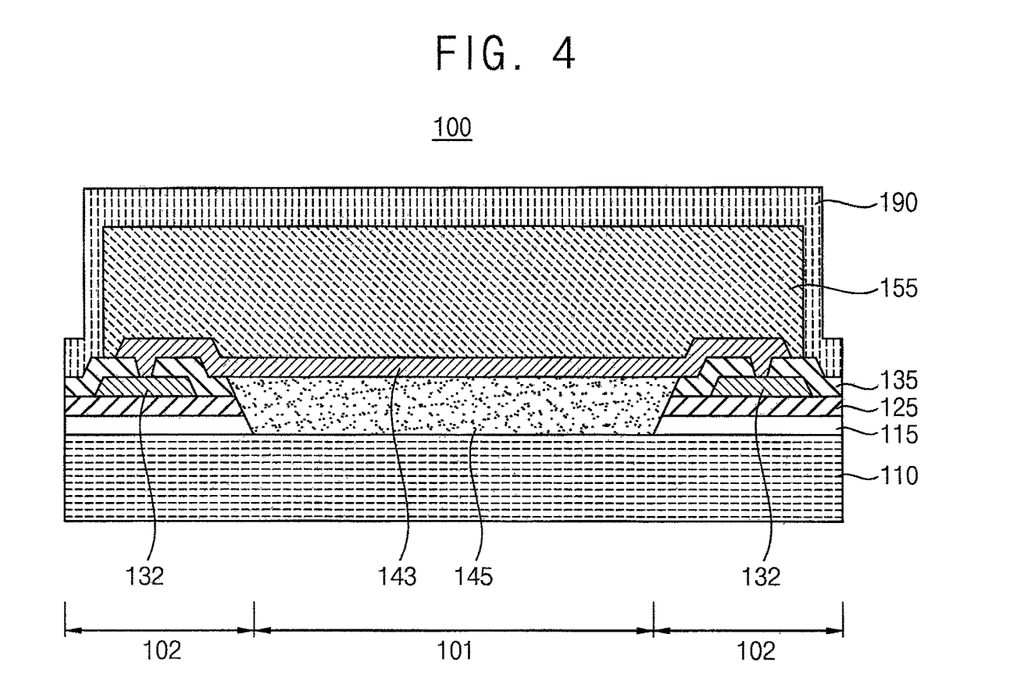
FIG. 4 is a cross-sectional view illustrating a first region and an edge portion of a second region of a display device according to an embodiment.

FIG. 4 is a cross-sectional view illustrating a first region and an edge portion of a second region of a display device according to an embodiment.

Referring to FIG. 4, an organic insulation layer 145 may be on the substrate 110 in the first region 101 in which the buffer layer 115, the gate insulation layer 125, and the insulation interlayer 135 including the inorganic material are removed/omitted. In an embodiment, the organic insulation layer 145 may include an organic material, and may be formed in the first region 101 to entirely cover the substrate 110.

The data line 143 may be on the insulation interlayer 135 and the organic insulation layer 145. In an embodiment, the data line 143 may be formed on an entirety of the first region 101 to connect the gate lines 132 of the second regions 102, which are located at the opposite sides of the first region 101, to each other.

The data line 143 may be located directly on the organic insulation layer 145 in the first region 101. In other words, the data line 143 may be formed directly on the organic insulation layer 145, so that an upper surface of the organic insulation layer 145 may directly contact a lower surface of the data line 143. In an embodiment where the data line 143 connects the gate lines 132 of the two second regions 102 that are separate from each other, signals may be transferred between the second regions 102.

Because the organic insulation layer 145 and the via insulation layer 155 including the organic material are respectively under and over the data line 143 in the first region 101 that is bendable, the organic insulation layer 145 and the via insulation layer 155 may absorb stress applied to the first region 101, and may provide flexibility. Therefore, according to an embodiment of the display device 100, the inorganic layer on the substrate 110 may be reduced or removed in the first region 101, and the organic layers and the data line 143 having high flexibility may be on the substrate 110 in only the first region 101. Thus, in such an embodiment, the stress applied to the first region 101 may be reduced, and cracks may be reduced or prevented even when the bending is repeatedly performed.

As illustrated in the embodiment above, only organic layers and flexible wires may be formed in the first region 101, so that stress may be alleviated, and so that cracking may be reduced or may not occur. However, a wire including metal may be directly formed on an organic layer. In an embodiment, the data line 143 including metal may be directly formed on, and may contact, the substrate 110 including an organic material as illustrated in FIG. 3. In another embodiment, the data line 143 including metal may be directly formed on and contact the organic insulation layer 145 including an organic material as illustrated in FIG. 4.

When metal contacts an organic layer, a metal oxide may be formed between the metal and the organic layer according to an oxidation-reduction reaction between the metal and the organic layer, or according to outgas emitted from the organic layer. The metal oxide may be irregularly etched in an etching process, and may thereby be recognized as a stain. Therefore, preventing the contact between the metal included in the wire and the organic layer may be necessary.

Figure 5:
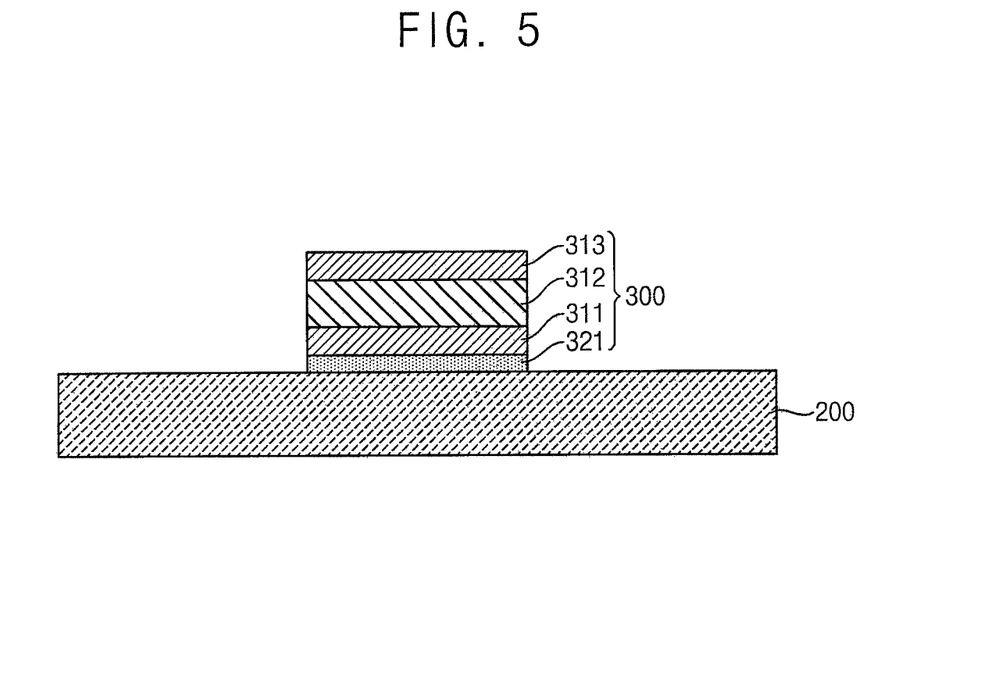
FIG. 5 is a cross-sectional view illustrating a portion of a display device according to an embodiment.

FIG. 5 is a cross-sectional view illustrating a portion of a display device according to an embodiment. For example, FIG. 5 may illustrate a portion of the first region 101 of the display device 100 illustrated in FIG. 3 or 4.

Referring to FIG. 5, a display device according to an embodiment may include an organic layer 200 and a wiring 300. In an embodiment, the organic layer 200 may correspond to the substrate 110 in FIG. 3 or to the organic insulation layer 145 in FIG. 4, and the wiring 300 may correspond to the data line 143 in FIG. 3 or 4. However, the present disclosure is not limited thereto.

The organic layer 200 may include an organic material having carboxylic acid (—COOH). For example, the organic layer 200 may include polyimide (PI).

The wiring 300 may be on the organic layer 200. The wiring 300 may include an oxidation resistant layer 321, a first metal layer 311, a second metal layer 312, and a third metal layer 313, which are sequentially layered.

The first metal layer 311 may include a first metal. In an embodiment, the first metal may be titanium (Ti). The first metal may be oxidized when contacting an organic layer (e.g., the organic layer 200). In an embodiment, a thickness of the first metal layer 311 may be in a range from about 200 angstroms (Å) to about 1200 Å. In another embodiment, the thickness of the first metal layer 311 may be about 700 Å.

The second metal layer 312 may be on the first metal layer 311. The second metal layer 312 may include a second metal that is different from the first metal. In an embodiment, the second metal may be aluminum (Al). The second metal may be oxidized when contacting the organic layer 200. In an embodiment, a thickness of the second metal layer 312 may be in a range from about 4000 Å to about 8000 Å. In another embodiment, the thickness of the second metal layer 312 may be about 6000 Å.

The third metal layer 313 may be on the second metal layer 312. In an embodiment, the third metal layer 313 may include the first metal. For example, the third metal layer 313 may include titanium (Ti). In an embodiment, a thickness of the third metal layer 313 may be in a range from about 100 Å to about 500 Å. In another embodiment, the thickness of the third metal layer 313 may be about 300 Å.

As described above, the first metal included in the first metal layer 311 and the second metal included in the second metal layer 312 may be oxidized when contacting an organic layer. In a comparative example, the first metal layer and/or the second metal layer may be in contact with the organic layer, and a metal oxide may be formed at a contacting portion. The metal oxide may be formed by an oxidation-reduction reaction between metal included in the first and/or second metal layers and organic material included in the organic layer, or may be formed when an outgas emitted from the organic layer containing moisture contacts the first and/or second metal layers. When the first metal layer is in contact with the organic layer, an oxide of the first metal (for example, $TiO_x$) may be formed at a portion of the first metal layer that contacts the organic layer.

When the second metal layer is in contact with the organic layer, an oxide of the second metal (for example, $AlO_x$) may be formed at a portion of the second metal layer that contacts the organic layer.

The metal oxide may not be easily etched by an etching gas during an etching process for forming a wiring. Accordingly, the metal oxide on the organic layer may be irregularly etched in the etching process, thereby being recognized as a stain.

To reduce or prevent the formation of the metal oxide that may otherwise be recognized as a stain (e.g., in the comparative example), the oxidation resistant layer 321 may be between the organic layer 200 and the first metal layer 311. The oxidation resistant layer 321 may reduce or prevent the first metal layer 311 and/or the second metal layer 312 from contacting the organic layer 200.

The oxidation resistant layer 321 may include a nitride of the first metal. In an embodiment, the oxidation resistant layer 321 may include a titanium nitride ($TiN_x$).

In an embodiment, a thickness of the oxidation resistant layer 321 may be in a range from about 30 Å to about 200 Å. When the thickness of the oxidation resistant layer 321 is less than about 30 Å, the first metal layer 311 and/or the second metal layer 312 may still be in contact with the organic layer 200, thereby forming the metal oxide that may be recognized as a stain. When the thickness of the oxidation resistant layer 321 is greater than about 200 Å, particles of the oxidation resistant layer 321, which are residual products during the etching process, may be excessively generated.

Table 1 illustrates levels of stains generated according to the thickness of the oxidation resistant layer 321 including titanium nitride ($TiN_x$).

TABLE 1

| | A thickness of the first metal layer (Ti) | A thickness of the second metal layer (Al) | A thickness of the third metal layer (Ti) | A thickness of the oxidation resistant layer | A level of a stain |
|---|---|---|---|---|---|
| 1 | 700 Å | 6000 Å | 300 Å | 10 Å | High |
| 2 | | | | 20 Å | Low |
| 3 | | | | 30 Å | No |
| 4 | | | | 40 Å | No |
| 5 | | | | 50 Å | No |

Referring to Table 1, a stain by the metal oxide (for example, titanium oxide ($TiO_x$)) may be intensified when the thickness of the oxidation resistant layer 321 is about 10 Å. The stain by the metal oxide may be reduced but recognized when the thickness of the oxidation resistant layer 321 is about 20 Å. However, the stain may not be generated when the thickness of the oxidation resistant layer 321 is greater than or equal to about 30 Å.

In an embodiment, a ratio of nitrogen to titanium (N/Ti) of the oxidation resistant layer 321 including titanium nitride ($TiN_x$) may be in a range from about 0.80 to about 1.15. The ratio may be such that the oxidation resistant layer 321 is not etched by an etchant that is used during an etching process.

In a process of manufacturing the display device, an etchant (for example, HF solution) for etching an insulation layer formed on the wiring 300 may be used. In this case, a portion of the wiring 300 may be etched together with the insulation layer formed thereon by the etchant. To prevent this, the oxidation resistant layer 321 may be formed of titanium nitride ($TiN_x$) having a ratio of nitrogen to titanium (N/Ti) in a range from about 0.80 to about 1.15. Therefore, the etching of the oxidation resistant layer 321 by the etchant may be prevented.

Hereinafter, a method of manufacturing the wiring 300 in FIG. 5 will be described with reference to FIGS. 6 to 8.

Figure 6:
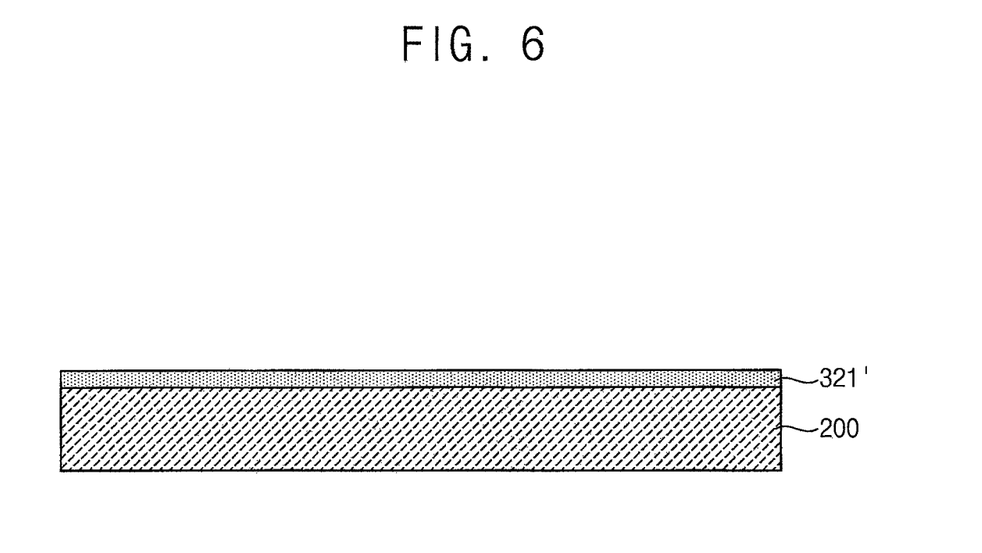
FIGS. 6, 7, and 8 are cross-sectional views illustrating a method of manufacturing a portion of a display device according to an embodiment.
Figure 7:
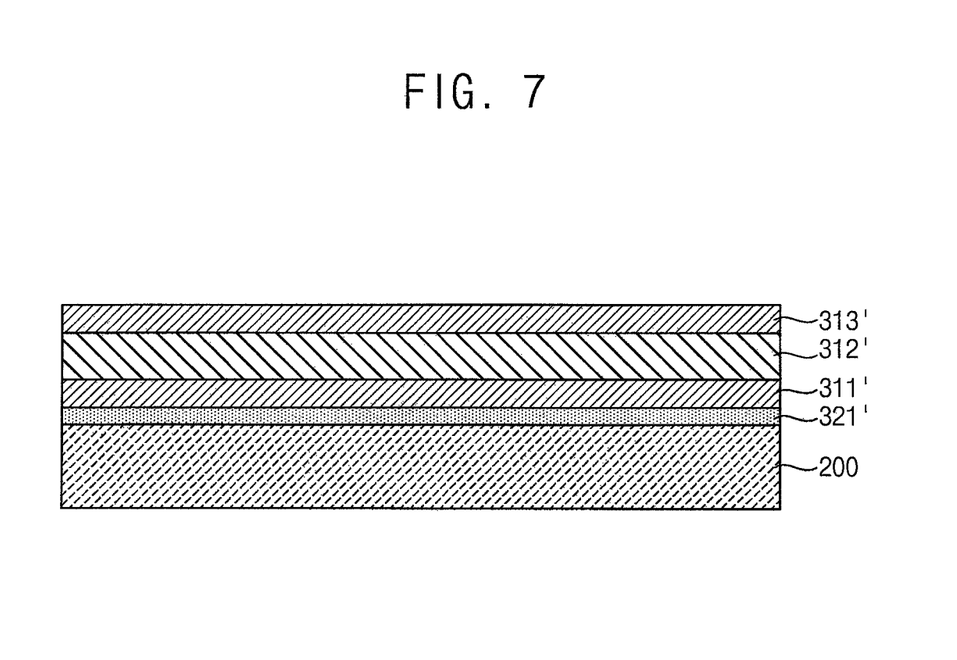
Figure 8:
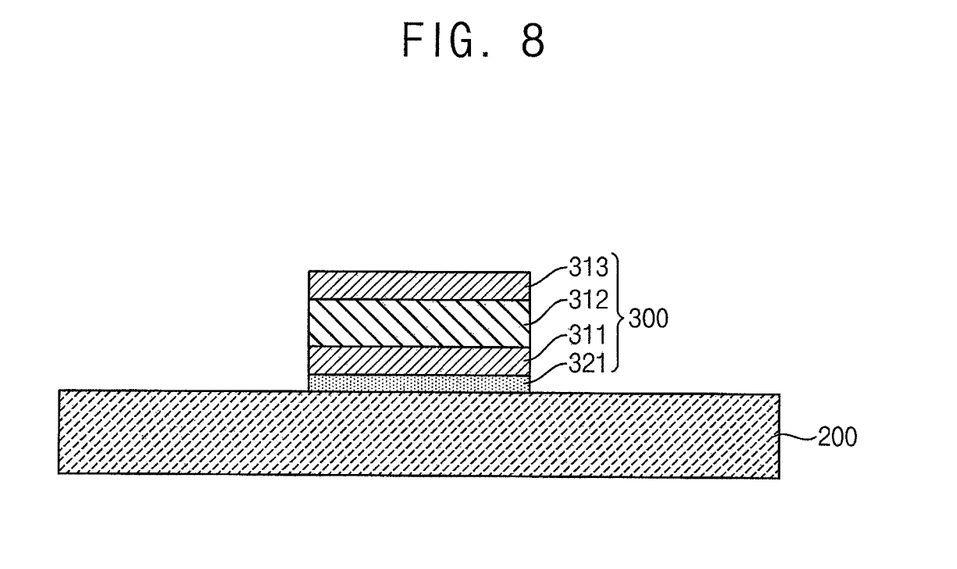

FIGS. 6, 7, and 8 are cross-sectional views illustrating a method of manufacturing a portion of a display device according to an embodiment.

Referring to FIG. 6, a preliminary oxidation resistant layer 321' may be formed on the organic layer 200. The preliminary oxidation resistant layer 321' may be formed by depositing a nitride of the first metal included in a preliminary first metal layer 311' shown in FIG. 7 on an upper surface of the organic layer 200 using sputtering, chemical vapor deposition, atomic layer deposition or the like. For example, the preliminary oxidation resistant layer 321' may be formed of titanium nitride ($TiN_x$).

Referring to FIG. 7, a preliminary first metal layer 311', a preliminary second metal layer 312', and a preliminary third metal layer 313' may be sequentially formed on the preliminary oxidation resistant layer 321'. The preliminary first metal layer 311' may be formed by depositing a first metal on an upper surface of the preliminary oxidation resistant layer 321'. The preliminary second metal layer 312' may be formed by depositing a second metal that is different from the first metal on an upper surface of the preliminary first metal layer 311'. The preliminary third metal layer 313' may be formed by depositing the first metal on an upper surface of the preliminary second metal layer 312'. For example, the preliminary first metal layer 311', the preliminary second metal layer 312', and the preliminary third metal layer 313' may be formed of titanium (Ti), aluminum (Al), and titanium (Ti), respectively.

Referring to FIG. 8, the preliminary oxidation resistant layer 321', the preliminary first metal layer 311', the preliminary second metal layer 312', and the preliminary third metal layer 313' may be etched so as to form the wiring 300. In an embodiment, the preliminary oxidation resistant layer 321', the preliminary first metal layer 311', the preliminary second metal layer 312', and the preliminary third metal layer 313' may be simultaneously etched. The preliminary oxidation resistant layer 321', the preliminary first metal layer 311', the preliminary second metal layer 312', and the preliminary third metal layer 313' may be etched using a photolithography process. For example, a photoresist layer may be formed on an upper surface of the preliminary third metal layer 313', and the photoresist layer may be exposed by a mask, developed, and then etched so as to form a photoresist pattern corresponding to the wiring 300. Then, the preliminary oxidation resistant layer 321', the preliminary first metal layer 311', the preliminary second metal layer 312', and the preliminary third metal layer 313' may be simultaneously etched by a dry etching using the photoresist pattern as an etch-stopper. When using the dry etching, the nitride of the first metal included in the preliminary oxidation resistant layer 321' may be etched together with the first metal and the second metal included in the preliminary first metal layer 311', the preliminary second metal layer 312', and the preliminary third metal layer 313'. Accordingly, the wiring 300 including the oxidation resistant layer 321, the first metal layer 311, the second metal layer 312, and the third metal layer 313 may be formed.

Figure 9:
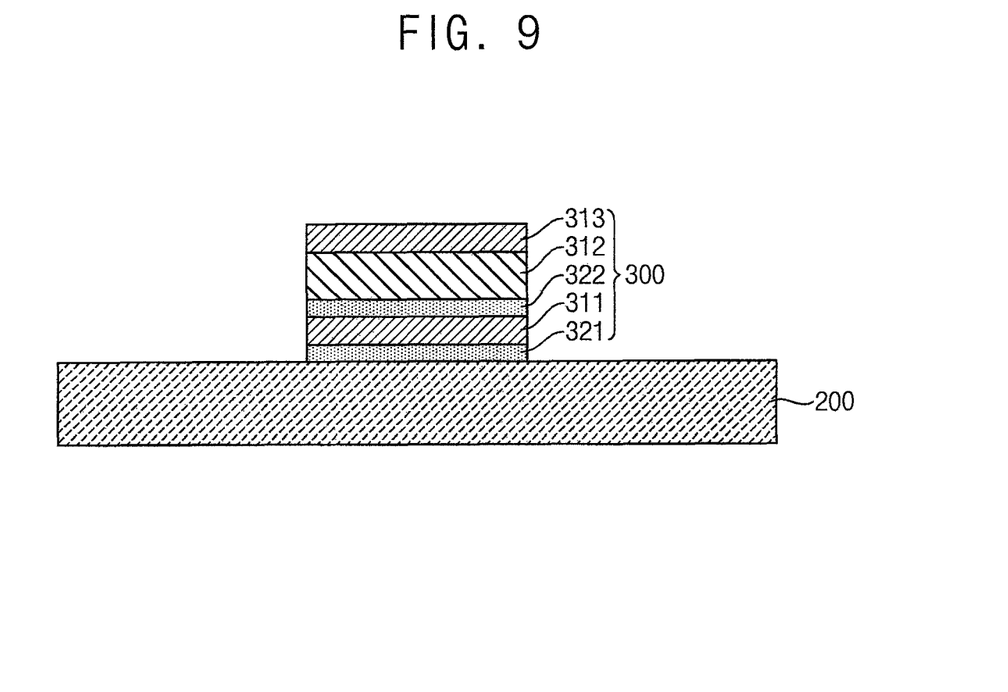
FIG. 9 is a cross-sectional view illustrating a portion of a display device according to an embodiment.

FIG. 9 is a cross-sectional view illustrating a portion of a display device according to an embodiment. For example, FIG. 9 may illustrate a portion of the first region 101 of the display device 100 illustrated in FIG. 3 or 4.

Referring to FIG. 9, a display device according to an embodiment may include an organic layer 200 and a wiring 300. In an embodiment, the organic layer 200 may correspond to the substrate 110 in FIG. 3 or to the organic insulation layer 145 in FIG. 4, and the wiring 300 may correspond to the data line 143 in FIG. 3 or 4. However, the present disclosure is not limited thereto. Elements of the display device according to an embodiment illustrated in FIG. 9, which are similar to or substantially the same as those of the display device according to an embodiment illustrated in FIG. 5, may be described with the same reference number, and repeated description thereof may be omitted.

The wiring 300 may be on the organic layer 200. The wiring 300 may include a first oxidation resistant layer 321, a first metal layer 311, a second oxidation resistant layer 322, a second metal layer 312, and a third metal layer 313, which are sequentially layered.

To prevent the formation of a metal oxide that may be recognized as a stain, the first oxidation resistant layer 321 may be between the organic layer 200 and the first metal layer 311, and the second oxidation resistant layer 322 may be between the first metal layer 311 and the second metal layer 312. The first oxidation resistant layer 321 may prevent the first metal layer 311 and/or the second metal layer 312 from contacting the organic layer 200. The second oxidation resistant layer 322 may prevent the second metal layer 312 from contacting the organic layer 200.

The second oxidation resistant layer 322 may include a nitride of the first metal. In an embodiment, the second oxidation resistant layer 322 may include a titanium nitride ($TiN_x$).

In an embodiment, a thickness of the second oxidation resistant layer 322 may be in a range from about 30 Å to about 200 Å. When the thickness of the second oxidation resistant layer 322 is less than about 30 Å, the second metal layer 312 may contact the organic layer 200 to form the metal oxide that may be recognized as a stain. When the thickness of the second oxidation resistant layer 322 is greater than about 200 Å, particles of the second oxidation resistant layer 322, which are residual products during the etching process, may be excessively generated.

In an embodiment, a ratio of nitrogen to titanium (N/Ti) of the second oxidation resistant layer 322 including titanium nitride ($TiN_x$) may be in a range from about 0.80 to about 1.15. The ratio may be such that the second oxidation resistant layer 322 is not etched by an etchant that is used during an etching process.

Hereinafter, a method of manufacturing the wiring 300 in FIG. 9 will be described with reference to FIGS. 10 to 12.

Figure 10:
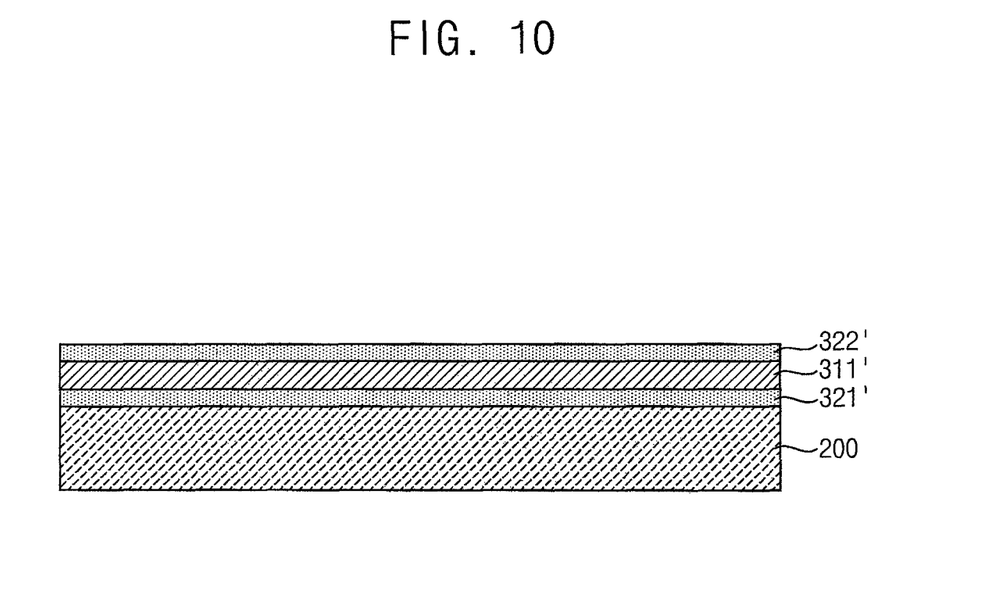
FIGS. 10, 11, and 12 are cross-sectional views illustrating a method of manufacturing a portion of a display device according to an embodiment.
Figure 11:
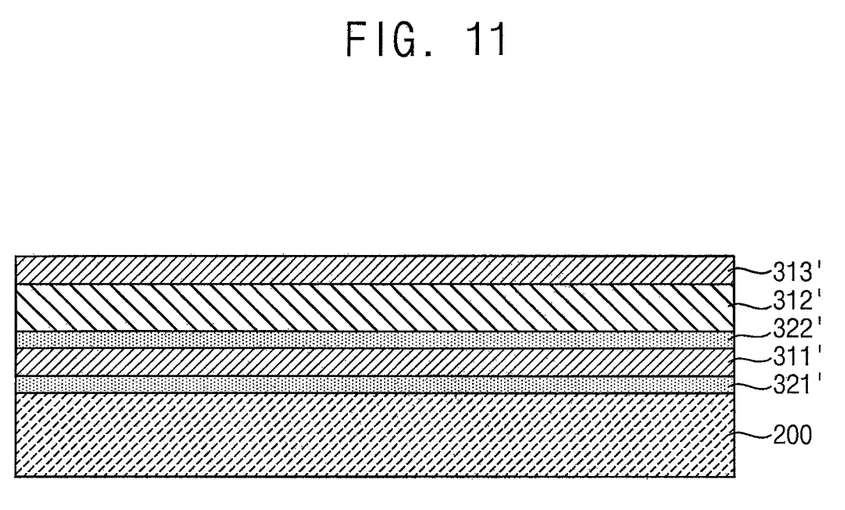
Figure 12:
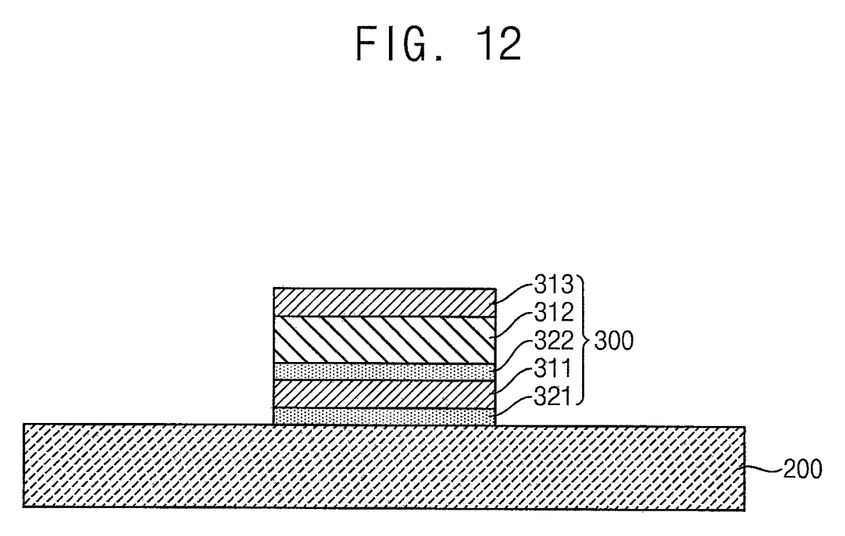

FIGS. 10, 11, and 12 are cross-sectional views illustrating a method of manufacturing a portion of a display device according to an embodiment. Elements of the method of manufacturing the display device according to an embodiment illustrated in FIGS. 10 to 12, which are similar to, or substantially the same as, those of the method of manufacturing the display device according to an embodiment illustrated in FIGS. 6 to 8, may be described with the same reference number, and repeated explanation thereof may be omitted.

Referring to FIG. 10, a preliminary first oxidation resistant layer 321', a preliminary first metal layer 311', and a preliminary second oxidation resistant layer 322' may be sequentially formed on the organic layer 200. The preliminary second oxidation resistant layer 322' may be formed by depositing a nitride of a first metal included in the preliminary first metal layer 311' on an upper surface of the preliminary first metal layer 311' using sputtering, chemical vapor deposition, atomic layer deposition or the like. For example, the preliminary second oxidation resistant layer 322' may be formed of titanium nitride ($TiN_x$).

Referring to FIG. 11, a preliminary second metal layer 312' and a preliminary third metal layer 313' may be sequentially formed on the preliminary second oxidation resistant layer 322'.

Referring to FIG. 12, the preliminary first oxidation resistant layer 321', the preliminary first metal layer 311', the preliminary second oxidation resistant layer 322', the preliminary second metal layer 312', and the preliminary third metal layer 313' may be etched so as to form the wiring 300. In an embodiment, the preliminary first oxidation resistant layer 321', the preliminary first metal layer 311', the preliminary second oxidation resistant layer 322', the preliminary second metal layer 312', and the preliminary third metal layer 313' may be simultaneously etched. The preliminary first oxidation resistant layer 321', the preliminary first metal layer 311', the preliminary second oxidation resistant layer 322', the preliminary second metal layer 312', and the preliminary third metal layer 313' may be etched using a photolithography process. When using dry etching, the nitride of the first metal included in the preliminary first oxidation resistant layer 321' and the preliminary second oxidation resistant layer 322' may be etched together with the first metal and the second metal included in the preliminary first metal layer 311', the preliminary second metal layer 312', and the preliminary third metal layer 313'. Accordingly, the wiring 300 including the first oxidation resistant layer 321, the first metal layer 311, the second oxidation resistant layer 322, the second metal layer 312, and the third metal layer 313 may be formed.

The display device according to embodiments of the present disclosure may be applied to a display device included in a computer, a notebook, a mobile phone, a smartphone, a smart pad, a PMP, a PDA, an MP3 player, or the like.

Although the display devices and the methods of manufacturing the display device according to the embodiments of the present disclosure have been described with reference to the drawings, the illustrated embodiments are examples, and may be modified and changed by a person having ordinary knowledge in the relevant technical field without departing from the technical spirit of the present disclosure described in the following claims, functional equivalents thereof to be included.

What is claimed is:
1. A display device, comprising:
   an organic insulation layer;
   a first metal layer on the organic insulation layer, the first metal layer comprising a first metal; and
   a first oxidation resistant layer between the organic insulation layer and the first metal layer, the first oxidation resistant layer comprising a nitride of the first metal, and being directly on a portion of the organic insulation layer.

2. The display device of claim 1, wherein the organic insulation layer comprises polyimide.

3. The display device of claim 1, wherein a thickness of the first oxidation resistant layer is in a range from about 30 angstroms (Å) to about 200 Å.

4. The display device of claim 1, wherein the first metal comprises titanium.

5. The display device of claim 4, wherein a ratio of nitrogen to titanium of the first oxidation resistant layer is in a range from about 0.80 to about 1.15.

6. The display device of claim 1, further comprising a second metal layer on the first metal layer, the second metal layer comprising a second metal that is different from the first metal.

7. The display device of claim 6, wherein the second metal comprises aluminum.

8. The display device of claim 6, further comprising a second oxidation resistant layer between the first metal layer and the second metal layer, the second oxidation resistant layer comprising a nitride of the first metal.

9. The display device of claim 8, wherein a thickness of the second oxidation resistant layer is in a range from about 30 Å to about 200 Å.

10. The display device of claim 6, further comprising a third metal layer on the second metal layer, the third metal layer comprising the first metal.

11. A display device, comprising:
- a substrate comprising an organic material; and
- a wiring directly on a portion of the substrate, the wiring comprising:
  - a first oxidation resistant layer comprising titanium nitride;
  - a first metal layer on the first oxidation resistant layer, the first metal layer comprising titanium; and
  - a second metal layer on the first metal layer, the second metal layer comprising aluminum.

12. The display device of claim 11, wherein a thickness of the first oxidation resistant layer is in a range from about 30 Å to about 200 Å.

13. The display device of claim 11, wherein the wiring further comprises a second oxidation resistant layer between the first metal layer and the second metal layer, the second oxidation resistant layer comprising titanium nitride.

14. The display device of claim 11, further comprising an organic insulation layer between another portion of the substrate and the wiring,
wherein the wiring is directly on the organic insulation layer.

15. The display device of claim 11, wherein the substrate comprises:
- a first region that is bendable; and
- second regions at opposite sides of the first region, and
wherein the wiring is in the first region.

16. The display device of claim 15, wherein the wiring extends from the first region to the second regions, and connects the second regions.

17. The display device of claim 11, wherein the wiring further comprises a third metal layer on the second metal layer, the third metal layer comprising titanium.

18. A method of manufacturing a display device, the method comprising:
- forming a first oxidation resistant layer on a substrate comprising an organic material, the first oxidation resistant layer comprising titanium nitride;
- forming a first metal layer on the first oxidation resistant layer, the first metal layer comprising titanium;
- forming a second metal layer on the first metal layer, the second metal layer comprising aluminum; and
- simultaneously etching the first oxidation resistant layer, the first metal layer, and the second metal layer to form a wiring.

19. The method of claim 18, further comprising:
- forming a second oxidation resistant layer between the first metal layer and the second metal layer, the second oxidation resistant layer comprising titanium nitride; and
- simultaneously etching the first oxidation resistant layer, the first metal layer, the second oxidation resistant layer, and the second metal layer to form the wiring.

* * * * *